(12) United States Patent
Giniunas et al.

(10) Patent No.: US 7,724,437 B2
(45) Date of Patent: May 25, 2010

(54) BRIGHTNESS PRESERVING LASER BEAM SHAPER

(75) Inventors: Linas Giniunas, Vilnius (LT); Romualdas Danielius, Vilnius (LT)

(73) Assignee: UAB MGF 'Sviesos Konversija', Vilnius (LT)

( * ) Notice: Subject to any disclaimer, the term of this patent is extended or adjusted under 35 U.S.C. 154(b) by 815 days.

(21) Appl. No.: 10/583,552

(22) PCT Filed: Dec. 16, 2004

(86) PCT No.: PCT/LT2004/000008
§ 371 (c)(1),
(2), (4) Date: Dec. 28, 2006

(87) PCT Pub. No.: WO2005/059626
PCT Pub. Date: Jun. 30, 2005

(65) Prior Publication Data
US 2007/0116079 A1    May 24, 2007

(30) Foreign Application Priority Data
Dec. 19, 2003  (LT)  ................................. 2003 108

(51) Int. Cl.
*G02B 27/10*  (2006.01)
(52) U.S. Cl. ........................ 359/619; 359/641; 359/708; 359/710; 359/621; 359/626; 359/628; 359/741; 359/797
(58) Field of Classification Search .................... 372/69, 372/50.12, 9, 101, 43; 359/641, 708, 710, 359/619, 621–624, 626, 741, 797
See application file for complete search history.

(56) References Cited

U.S. PATENT DOCUMENTS 5,299,222 A    3/1994   Shannon et al.

(Continued)

FOREIGN PATENT DOCUMENTS

DE    195 00 513 C1    7/1996

(Continued)

OTHER PUBLICATIONS

Koechner W., "Solid-State Laser Engineering". Sixth Revised and Updated Edition, pp. 225-226, 2006.

(Continued)

*Primary Examiner*—Evelyn A. Lester
(74) *Attorney, Agent, or Firm*—Oblon, Spivak, McClelland, Maier & Neustadt, L.L.P.

(57) ABSTRACT

The current invention describes the method of making symmetrical radiation of extremely asymmetrical light sources, e.g. laser diode bars, using the shaper of three optical elements that preserve the brightness of the initial light source. The first element of the shaper-collimator of the fast axis-images the light source in the direction of the fast axis directly into the output plain of the shaper. The second and the third element of the shaper are the multi-segment elements that separate and optimally redistribute different beams and focus these in the direction of the slow axis. The surfaces of the shaper optical elements are described by the surfaces of the second and higher order, which enables compensation of different distortions, for instance field curvature aberration, distortion caused by the light source bending, etc. The shaper offers optimal order of secondary beam redistribution that has the least possible impact on the initial beam brightness. The device also offers the method for "smile" distortion compensation and the means of combining several light sources in the shaper using polarizing and dichroic mirrors. In the case of laser diode stack it is proposed to employ the same beam shaping principle with individual multi-edged prism for each of the laser diode bars and one multi-segment element common for all laser diode bars.

13 Claims, 5 Drawing Sheets

U.S. PATENT DOCUMENTS

| | | |
|---|---|---|
| 5,504,302 A | 4/1996 | Hentze et al. |
| 5,798,877 A | 8/1998 | Nightingale et al. |
| 5,825,551 A | 10/1998 | Clarkson et al. |
| 6,044,096 A | 3/2000 | Wolak et al. |
| 6,108,138 A | 8/2000 | Ophey et al. |
| 6,151,168 A | 11/2000 | Goering et al. |
| 6,337,873 B1 | 1/2002 | Goering et al. |
| 6,407,870 B1 * | 6/2002 | Hurevich et al. ............ 359/636 |
| 6,421,178 B1 * | 7/2002 | Lissotschenko et al. ..... 359/641 |
| 6,700,709 B1 * | 3/2004 | Fermann .................... 359/641 |

FOREIGN PATENT DOCUMENTS

| | | |
|---|---|---|
| DE | 196 23 762 A1 | 12/1997 |
| DE | 197 43 322 A1 | 7/1998 |
| EP | 1 059 713 A2 | 12/2000 |
| LT | 2002042 A | 7/2003 |
| RU | 2 130 221 | 5/1999 |
| RU | 2 165 097 | 4/2001 |
| WO | WO 01/27686 A1 | 4/2001 |

* cited by examiner

BRIGHTNESS PRESERVING LASER BEAM SHAPER

1. THE AREA OF TECHNOLOGY

The invention is classified to the series of inventions developed for shaping of non-diffraction-limited asymmetrical light beams, for instance, for spatial distribution of the light emitted from the laser diode bars. This method of beam transformation could be used in end pumped solid-state lasers, for fibre coupling and material processing, as well as in medicine area.

2. THE LEVEL OF TECHNOLOGY—CURRENTLY APPLIED SOLUTION/SOLUTIONS

Large aperture laser diodes or laser diode bars are powerful, compact, and long-lasting light sources, widely used for scientific and industrial applications. However, the emission of such lasers is rather asymmetrical, which makes the application of these more difficult. The transverse dimensions of beam in the plane perpendicular to the laser p-n junction (hereinafter referred to as fast or y-axis direction) may be of 0.2-1 μm (FIG. 1), while radiation divergence angle is 60-90 degrees, the beam size in the plane of p-n junction (hereinafter referred to as slow or x-axis direction) may reach 60 μm-10 mm, and divergence angle is approx. 8-12 degrees. In the plane of fast axis the beams are diffraction limited, while in the plane of slow axis the beam can be ten to several thousand times diffraction limited. In order to characterise beam quality, $M^2$ parameter is used (see W. Koechner Solid-State Laser Engineering, Springer-Verlag, $4^{th}$ ed., 1999), showing how many times the divergence of a beam exceeds the divergence of a diffraction-limited beam. Total beam brightness is the product of the beam parameters in both axes $M_x^2 * M_y^2$ (for ideal diffraction limited beam $M_x^2 * M_y^2 = 1$). General laws of the optics do not allow increasing of beam brightness, however the initial brightness must be preserved while shaping the beams (making these symmetrical). Beam shaper described in this invention is used for equalisation of the beam quality factor in both directions of fast and slow axes ($M_x^2 = M_y^2$ condition) simultaneously minimising $M_x^2 * M_y^2$ product, i.e. preserving its initial brightness.

There are several ways to make the beams symmetrical or to control the asymmetry of high-aperture laser diode radiation beam. Radiation of each laser comprising laser diode bar can be introduced in different optical fiber, having output end connected in symmetrical bundle (U.S. Pat. No. 5,299,222). Asymmetrical beams may be transformed using the sets of image rotating mirrors (U.S. Pat. No. 6,044,096), two parallel mirrors (U.S. Pat. No. 5,825,551), sets of glass plates (DE19743322) and prisms (U.S. Pat. No. 5,798,877) or appropriately rotated cylindrical lenses (DE19623762). However, these methods for beam shaping are of poorer features if compared with another relative group of beam shapers, where the beams are shaped using multi-segment optical elements that redistribute the constituent components of initial beam so that the beam becomes symmetrical. This shaper group is mostly correlated with the brightness preserving beam shaper described in this invention, therefore in the next chapter advantages and disadvantages of the group of the latter shapers are analysed in detail.

3. THE CRITICS ON EXISTING SOLUTIONS

In the patent of V. Lissotschenko et al. (U.S. Pat. No. 6,421,178) it is recommended to transform the radiation of laser diode bars (collimated in direction of both fast and slow axes) using two optical elements with propeller-like surfaces, i.e. the surfaces, the angle of normal vector of which with x0z plain equally varies as the function from x co-ordinate. Such surfaces allow providing different radiation directions for different laser diode bar beams and together with Furie transform element between the propeller-like surface and final focusing element yield symmetrical beams. This beam shaper distinguishes by low loss and homogeneity of intensity distribution in the output of beam shaper, since the beams have no sharp edges in their paths.

Than all the optical elements of the beam shaper are assembled on a single plate, one has a single optical chip with low sensitivity to incorrect input beam adjustment. However manufacturing of the surfaces according to the patent requires sophisticated equipment such as micro ultrasonic processing or quartz polishing with electron beam (U.S. Pat. No. 5,504,302). Although six optical elements are used in the beam shaper described in the patent U.S. Pat. No. 6,421,178, it has no possibility to correct field curvature aberration of the first micro-cylindrical lens, that is why initial brightness of the light source is lost. Besides, beam redistribution order obtained by propeller like surfaces is not optimal in the aspect of brightness preservation.

In the other group of patents (U.S. Pat. No. 6,151,168, WO01/27686, EP1059713) every light beam from the different emitter in a laser diode bar is directed in different directions by tilting around z-axis (which coincides with the initial beam emission direction) the micro-cylindrical lens of a fast axis collimator. Behind the fast axis collimator the beams are converged one above another by an additional spherical, cylindrical or graded index lens. To restore the initial beam directions, thin prisms or sets of mirrors (U.S. Pat. No. 6,151,168 R .Goering et al., WO01/27686 P. Schreiber et al.), as well as sets of shifted (in the direction of x-axis) thin cylindrical lenses (one on another) (EP1059713, G. Piccinno et al.) may be used. Although almost all the optical elements in the mentioned patents can be manufactured applying the conventional methods of a glass processing, the initial brightness of a laser diode bar is lost due to the field curvature aberration of the micro-cylindrical lens, non-optimal order of redistribution of the beams, aberrations in the spherical and cylindrical surfaces of optical elements. Besides, in these designs the possibility of correction of beam distortion due to the bend of a laser diode bar—"smile" distortion is not included. The described beam shaping methods can be applied in the systems where brightness preservation is not the crucial requirement, for instance in high power systems (>100 W). However in the end pumped solid state lasers and some cases of material processing preservation of brightness of the light source can be a critical parameter determining quality parameters of the whole system.

In the patent by R. Danielius, L. Giniūnas (LT5060) a multifaceted homogeneous prism is used to make the beam symmetrical by separating initial beam into several secondary beams with different directions of propagation. In the point of space, where the beams appear one above each other in direction of y-axis, their directions of propagation are restored by means of another refractive element—the set of glass plates. Output surfaces of these plates can be not only the planes but also other different surfaces of the higher order that can act in the both directions of slow and fast axis. Such shaper of asymmetrical beams is extremely compact and does not require high precision during assembling. However, having shaped the beams with the shaper described in LT5060 patent, the initial brightness of the beam is lost, therefore beam shaping method is not very highly applicable when it is intended to obtain (after shaper) the beams of limited brightness and of lower than 100 μm diameter. Brightness loss is related with non-corrective field curvature aberration of the fast axis collimator, light source geometrical distortions ("smile" distortion), and non-optimal secondary beam redistribution order. Also in this patent there is not foreseen the possibility of coupling the radiation of several light sources in one shaper, for instance in the case of laser diode stack.

Prototype. In the patent by A. Wasmeier (DE19500513) as well as in its improved version by R. Goering et al (U.S. Pat. No. 6,337,873) it is proposed to insert different laser diode bar beams (collimated in the direction of fast axis) one over another using the different "directing" optical element, which consists of different segments active in both fast and slow axis directions. For beam direction recovery the second "redirecting" optical element, e.g. the set of thin prisms consisting of equal number of segments is used. After this secondary optical elements the beams occur one over another, having gained the same direction of propagation. Finally, the beam is shaped by supplementary cylindrical and spherical lens. Such beam shaping method works well, when it is intended to shape the beam with the cross-section diameter is >1 mm and the numerical aperture is approx. 0.1. However, in high brightness applications, e.g. in end pumped more then 10 W power solid-state lasers, the beam shaping method described in the U.S. Pat. No. 6,337,873 patent becomes not efficient because of some certain reasons: first, the method does not include the possibility of compensation of field curvature aberration of micro-cylindrical lens, hence such shaper can not be used to shape the beams with cross-section diameter that is less than 100 μm. In the case when laser diode bar consists of high number of lasers (e.g. 19) the method described in the U.S. Pat. No. 6,337,873 patent also becomes less efficient because of tilting of elliptically shaped beams in respect to the input face of "redirecting" element. In order to preserve power efficiency of the shaper, it is necessary to increase the width of "redirecting" element segments in the direction of fast (y) axis, which increases numerical aperture of the beam, and brightness of the beam is lost. When increasing geometrical parameters of beam shaper in the direction of z-axis, the requirements for optical element accuracy also become higher. The quality of the high brightness laser diode bar beam shapers is limited by the bending of the bar itself ("smile" distortion). In the method described in the U.S. Pat. No. 6,337,873 patent the possibility for bar bending compensation is not foreseen, therefore the described beam shaping method is more appropriate for high power (>100 W) shapers where bar bending effects does not occur.

The essential difference of this invention is that in the beam shaper beams in both fast and slow axis directions are focused independently and the first optical element of the beam shaper fast axis collimator images light source not into the infinity, but into the output plain of the shaper. This characteristic of the shaper enables to use a very low number of optical elements in the shaper. Using the higher order surfaces of the optical elements, e.g. quasi-conical, bent propeller-like, etc., aberrations that reduce beam brightness and are characteristic to the above mentioned beam shapers are compensated. In the shaper it is proposed to use the optimal order of secondary beam redistribution as it has the lowest possible impact on the initial brightness of the beam. It is also proposed to apply the method of compensation of "smile" distortion. The method for combining of emission from several light sources in the shaper using polarising and dichroic mirrors is also proposed. Employing the methodology described in the current invention it is possible also to make laser diode stack beams symmetrical while separating and optimally redistributing emission from different laser diodes by multi-segment micro-optic elements.

4. THE ESSENCE OF THE INVENTION

The invention describes optical layout that enables making symmetrical even very asymmetrical light beams, e.g. these of laser diode bars, broad aperture diode lasers, etc. having maximally preserved the initial brightness of a light source and using smaller number of optical elements. The idea of the invention is based on the fact that in the shaper initial beam focusing is separated in fast and slow axis directions, and optimised optical element surfaces of higher order are used for beam shaping and optimal order of secondary beam redistribution is selected. In beam shaper aperture of a light source by first optical element is imaged in the direction of fast axis directly into the output plain of shaper. Depending on the configuration of light source output aperture, beam redistribution multi-segment optical element may be in the near and in the far field of the light source field. Redistributing element provides secondary beams with such propagation directions that in certain distance beam weight centres locate one over the other in y-axis direction. In this spatial point beam propagation directions are made uniform by beam refraction on the input surfaces of the second multi-segment element. Output surfaces of this element that are close to cone-shaped, with certain magnification in the direction of slow axis image the light source or part of it into the output plain of the shaper and direct different beams into the focus in the direction of the fast axis. In order to preserve the initial brightness of the light source, certain improvements were introduced in the shaper. Field curvature aberration of the first focusing element is proposed to be corrected by optical surfaces of multi-segment elements, i.e. using not the plains, but the surfaces of higher order, e.g. cone-shaped. There is also proposed the optimal order of secondary beams redistribution, the method of "smile" distortion compensation by the first multi-segment element, polarisation and dichroic combining of the beams from different source in the shaper and making the laser diode stack beam symmetrical by balancing the $M^2$ parameter in the direction of both axes and eliminating the unfilled space between different lasers in the stack.

5. BRIEF DESCRIPTION OF THE DRAWINGS

The present invention is described below, by way of example, with reference to the accompanying drawings, wherein.

6. DETAILED DESCRIPTION OF THE INVENTION

Figure 1:
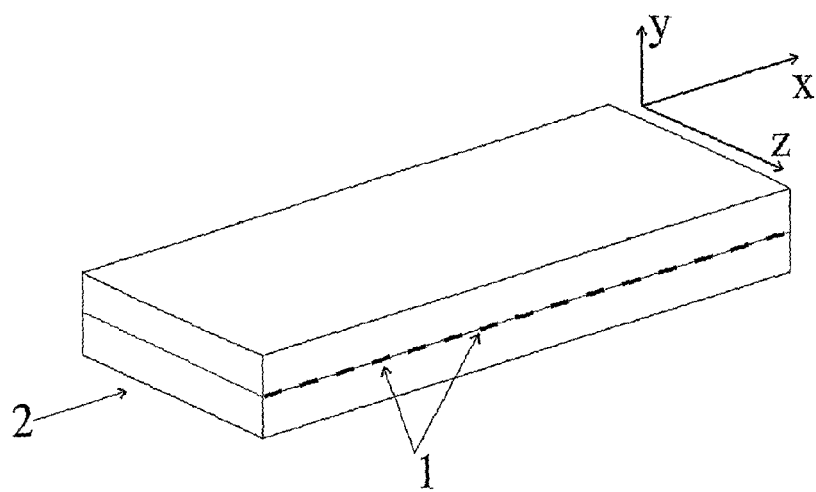
FIG. 1 illustrates typical structure of a laser diode bar with many emitters.

The FIG. 1 schematically depicts typical laser diode bar 2 with a number of laser diodes 1 radiating in the direction of z-axis. Characteristic dimensions of the bar 2 are as follows: laser height in the direction of y-axis is ~1 μm, separate laser 1 width is from 50 to 200 μm, the distance between two lasers 1 is from 10 to 500 μm. Laser diode bar radiation in the direction of y (fast) axis varies by 30-50-degree angle, and in that of x (slow) axis it varies by 8-12-degree angle (full width at $e^{-2}$ level). Beam shaper described in the current invention has been designed to make symmetry on both different modifications laser diode bars 2 and broad aperture laser diode radiation in the direction of x and y-axes, having preserved the brightness of light source.

Figure 2:
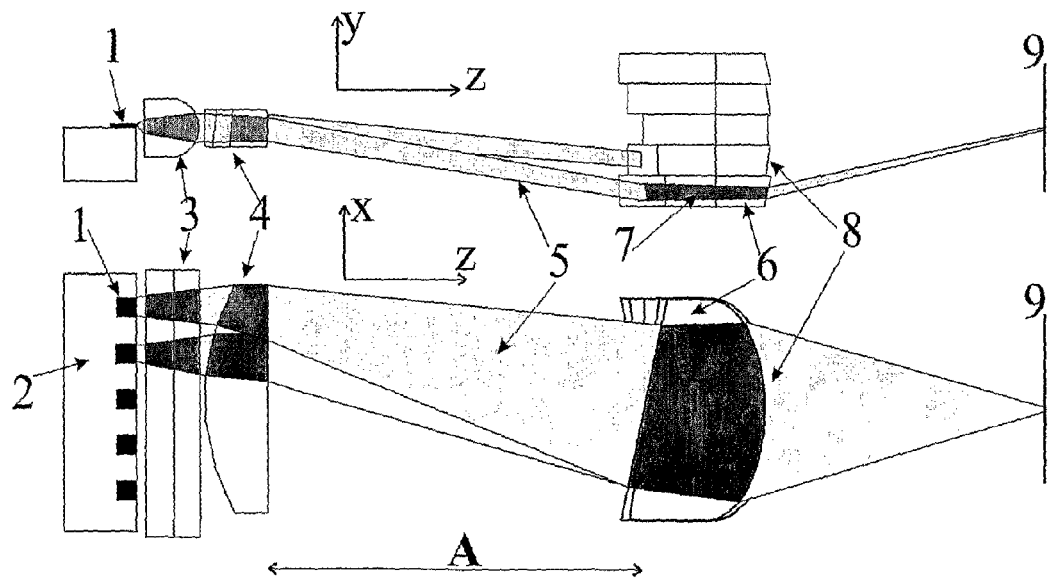
FIG. 2 illustrates schematic layout of a brightness preserving beam shaper with beam separation in the near field.

In order to simplify the description of beam shaper in following we consider five laser diodes in single bar (FIG. 2). However, the described invention should be related to all light sources emitting similar light beams—laser diode bars of both low and high filling factor, with different laser number as well as bar stacks, broad aperture laser diodes, etc.

The first element used in beam shaper diagram is analogous to fast axis collimator, for instance, acylindrical microlens 3. However contrary to the imaging into infinity used in different patents, the microlens images the light source with certain magnification in the direction of fast axis directly into output plain of the beam shaper 9 (FIG. 2). The surface shape of acylindrical microlens 3 must be optimised for minimum spherical aberration in direction of y-axis that occurs when imaging the light source into the output plain 9.

Depending on the laser diode bar 2 filling factor, asymmetrical initial beam may be split into a number of beams in both the far or near field of the light source. Beam separation in the near field (FIG. 2) should be employed only when the distances between different lasers on the bar 2 are relatively large and beams of different lasers still do not overlap in the separating element 4.

Beam separation in the near field allows compensation of aberration that occurs because of bending of the light source or first micro-cylindrical lens, which in laser diode bar optics is called "smile" distortion. Having measured light source and lens bends these may be corrected when selecting appropriate parameters of the refraction surface of separating element 4. The first surface of separating element 4 operates in the direction of both slow and fast axe. This allows minimize a distance between separating element and the fast axis collimator.

Figure 3:
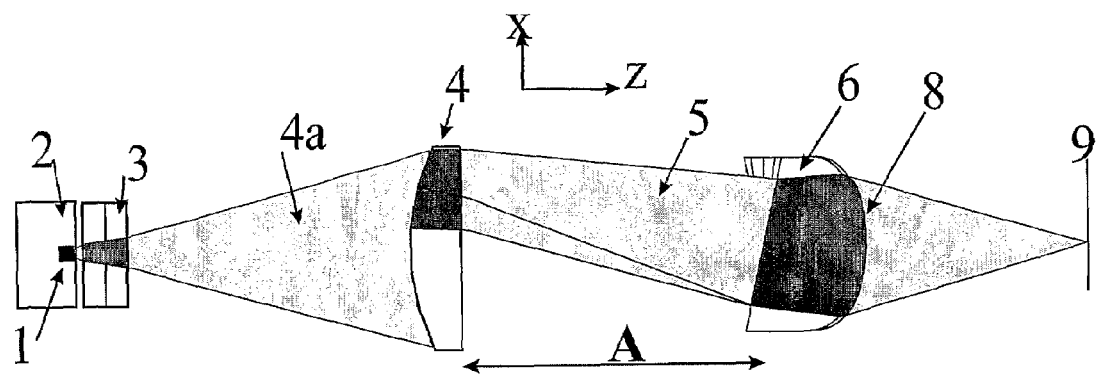
FIG. 3 illustrates schematic layout of a brightness preserving beam shaper with beam separation in the far field.

When the beams of different lasers overlap in the fast axis collimator 3 or in the case when the beam of one broad aperture diode laser is shaped, it is more convenient to split the beam in the far field (FIG. 3). In both cases the initial beam 4a is to be split into the secondary ones 5 by multi-segment elements 4. These could be monolithic multi-edged prisms, prism or mirror sets, etc. diffraction or holographic elements. The split secondary beams 5 are provided with such propagation directions that in the certain distance A in the direction of z-axis (FIG. 3) the weight centres of the beams occur one over another, equally located in the direction of y-axis. On this spatial point the directions of beam radiation are made uniform using the second multi-segment optical element 6, which correct radiation direction of each of the beams 5 so that the beams in it gain uniform radiation direction 7, parallel to z-axis (FIG. 3).

The beams of uniformed propagation direction 7 are further focused by the output surfaces 8 of the second multi-segment element 6 so that by this quasi-conical surface the light source 1 or part of it is imaged in the direction of the slow x-axis with the certain magnification on the shaper output plain 9, and in the direction of the fast y axis it is directed to the common focus of the shaper.

Figure 4:
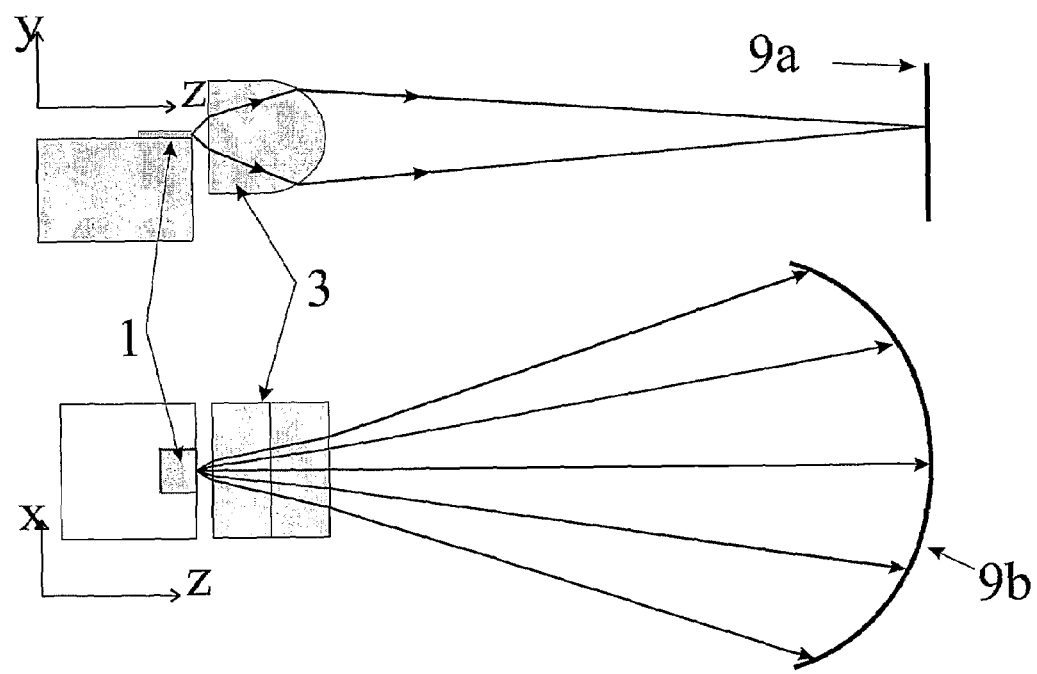
FIG. 4 illustrates field curvature aberration of micro-cylindrical lens.

In order to image by micro-cylindrical lens 3 the light source 1 output aperture to the output plain of the shaper 9 with magnification lower than ×100, one shall indispensably face the field curvature aberration of micro-cylindrical lens, which is related to the fact that rays whose propagation radiation directions make an angle with the y0z plain focus close to the lens. The focus surface of micro-cylindrical lens 3 is concave 9a, 9b on the x0z plain as depicted in FIG. 4. If the rays that are propagating parallel to the y0z plain are focused in the plain 9a, then the diagonal beams shall focus closer and will get unfocussed in the plain 9a. This effect reduces beam shaper efficiency in respect to brightness preservation. The issue may be resolved using higher order surfaces in different segments (FIG. 2, 3) of the first, beam separating element 4. In this case micro-cylindrical lens 3 must image the light source beyond the focus plain 9 so that only diagonal beams would be focused on the shaper focus plain 9 (ends of the curve 9b must coincide with the plain 9a (FIG. 4). The rays propagating closer to the y0z plain can be additionally focused in the direction of fast axis by segment surfaces of the splitting element 4 in the case when the element 4 is in the far field (FIG. 3). The radius of curvature of the above mentioned surfaces should increase in the direction of y-axis, i.e. focusing power should reduce when moving away in both directions from z-axis. The surface of each segment is part of the cone turned in the space so that it would not only focus but also direct in appropriate direction the secondary beams.

In the case when the first multi-segment element is in the near field (FIG. 2), field curvature aberration can be corrected not by the surfaces of the first multi-segment element 4 but by the these of the input of the second multi-segment element 6, as these surfaces not only recover beam radiation directions but also act as cylindrical lenses in the direction of fast y axis with equally decreasing focusing power in both directions from the shaper axis z.

Figure 5:
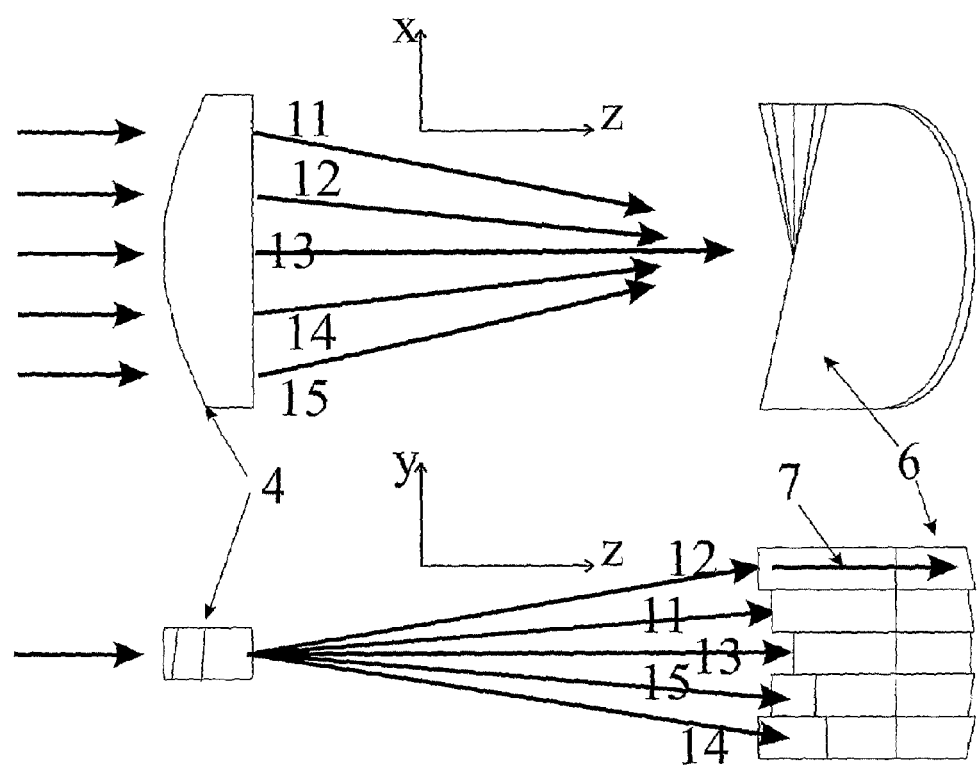
FIG. 5 illustrates regrouping order of the secondary optical beams yielding minimized twisting of the beams.

When processing asymmetrical light beam by multi-segment element 4, in the second multi-segment elements 6 the width of secondary beam 7 (FIG. 2) in the direction of y-axis increases because of the twisting of elliptically shaped beam. In order to avoid energy losses in adjacent segments one should increase segment width in the direction of y-axis, which reduces beam brightness at the shaper output. In the current invention it is proposed to reduce the described negative effect by using appropriate secondary beam regrouping order (FIG. 5). When redistributing the elliptically shaped beams by multi-segment elements the greatest twisting occurs when beam propagation directions are drastically changed simultaneously in both x0z and y0z plains. Twisting of the elliptically shaped beam may be reduced directing the side components of the initial beam 11, 15 (FIG. 5) in the direction of slow axis so that the beams would move away from the x0z plain as less as possible, and the central components of the initial beam 12, 14 in the direction of fast axis so that the components would move away from the y0z plain as less as possible. Here, in order to simplify the procedure, the description is limited to five secondary beams (direction no. 13 of the central beam is not changed), however such beam redistribution order is also optimal for higher beam number.

The method of beam shaping described in the current invention is convenient because the surfaces of all optical elements used in the shaper may be manufactured employing conventional optical surface processing methods (grinding, polishing), additionally having used digital positioning of the optical component and a tool. Tangent plain at any point of such surfaces does not intersect with the surface but tangents by the straight line at any point of the surface.

Figure 6:
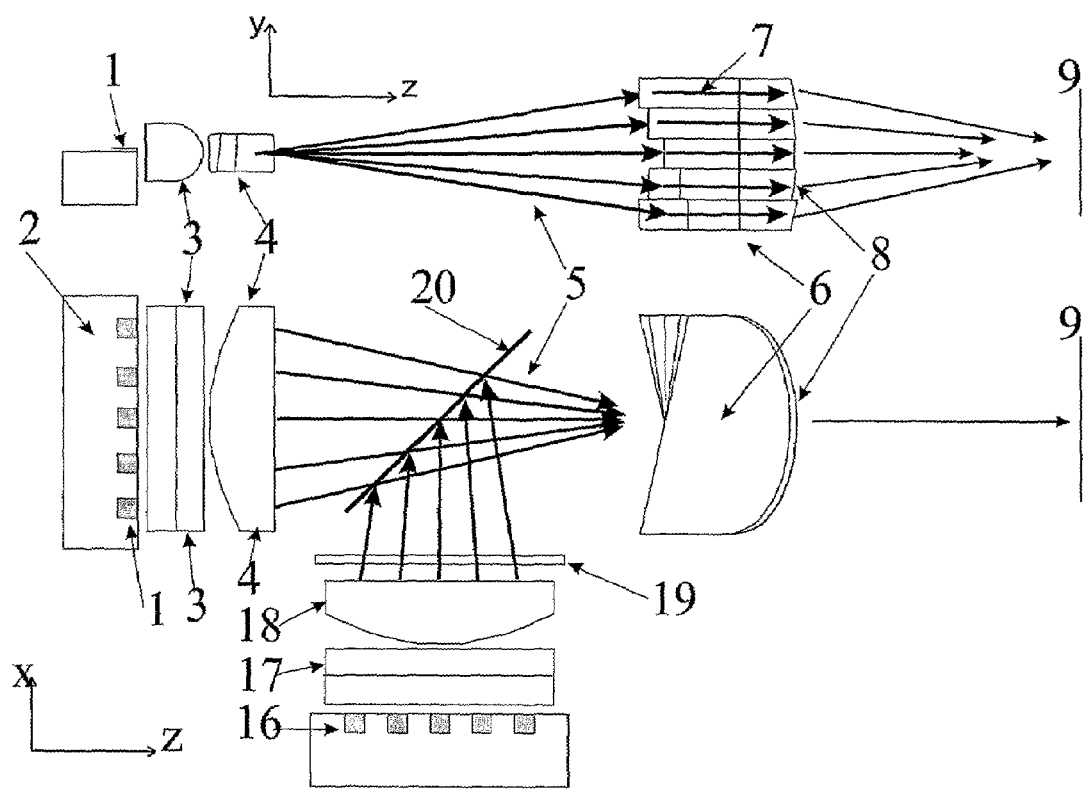
FIG. 6 illustrates optical layout depicting power scaling possibility in the beam shaper when several asymmetrical beams are combined into single output using polarising or dichroic mirrors.

The diagram of asymmetrical beam shaper described in the current invention is convenient in the aspect of power scaling when several asymmetrical beams are combined into one output using polarising or dichroic mirrors. In the diagram depicted in FIG. 6 the radiation of the first 1 and the second 16 light source with the equal wavelength, for instance, these of the two laser diode bars are collimated by identical fast axis collimators 3 and 17 and are separated by the two different multi-segment elements 4 and 18. Polarisation of the second source 16 radiation is turned by 90° angles with low order λ/2 phase plate 19. Then, radiation of the both sources are overlapped using polarising mirror 20 and are directed into the one multi-segment element 6, where the beams are finally shaped as described above. Under the above principle it is also possible to combine the beams of four laser diode bars, with two bars having similar wavelength, for instance with 808 nm and 940 nm wavelength. Initially the beams with equal wavelength are combined using polarising mirror, and further the beams with different wavelength are combined with dichroic mirror, having common second multi-segment element for all four bars.

Figure 7:
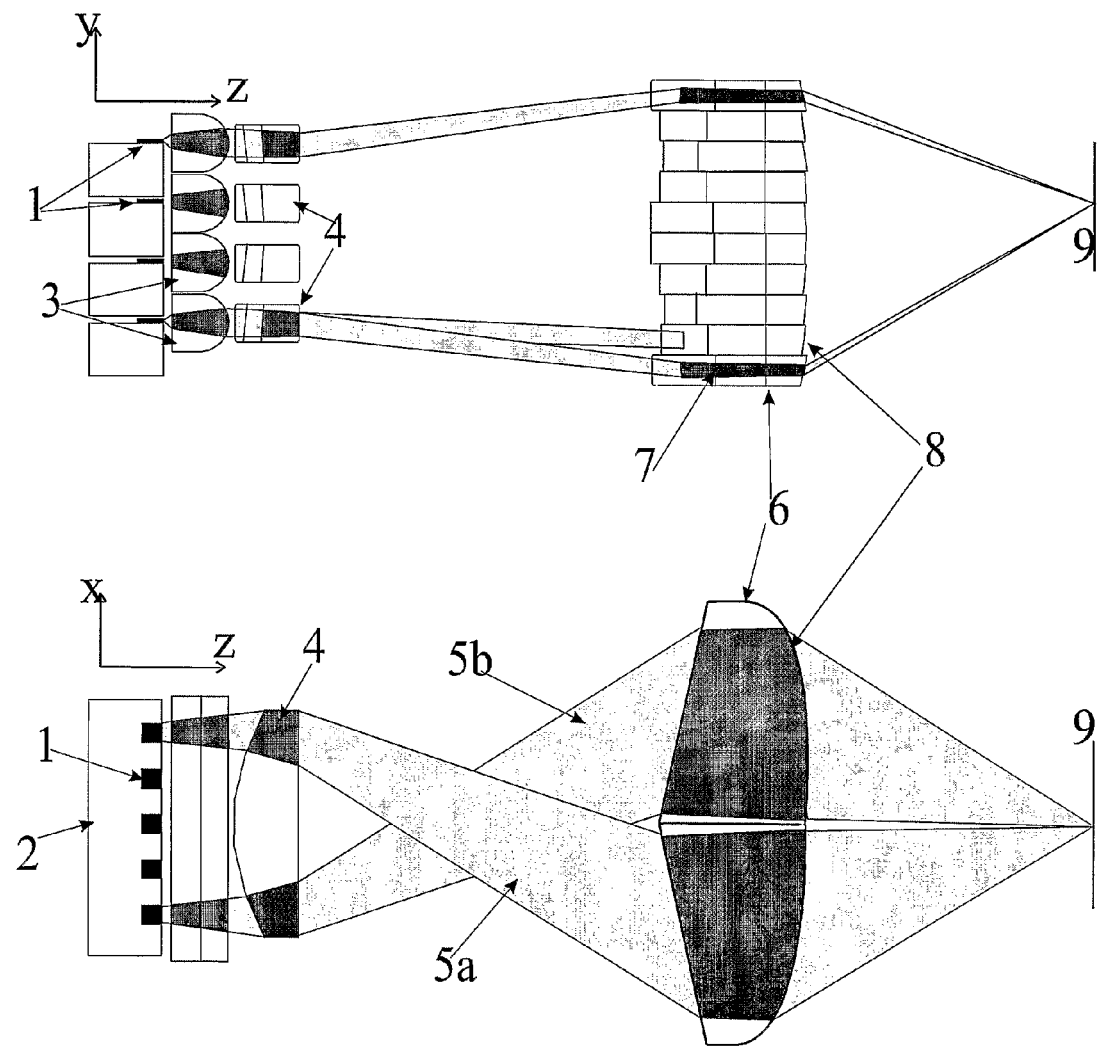
FIG. 7 illustrates optical layout of the high brightness beam shaper optimized for laser diode stack.

The methodology of beam shaping described in the current invention also can be applied for laser diode stack shaping having balanced the $M^2$ parameter in the directions of both fast and slow axes, simultaneously having eliminated unfilled space between different lasers in the stack. The principle of laser diode stack beam shaping is depicted in FIG. 7. In order to simplify the diagram, four laser diode bars and five laser diodes per each bar limit the figure. Two laser diode beams located in opposite parts of the laser diode bar 5a, 5b, in the primary multi-segment elements 4 are in pairs directed into one plate of the second multi-segment element 6, where the plate input surface is composed of two plains with different normal vectors. Radiation directions of the beams 7 refracted in the above mentioned plains are made uniform. For balancing the values of $M^2$ parameter in the directions of the fast and slow axes, more than one beam may be directed into the one plate of multi-segment element 6. For instance, three or four beams may be directed in the above mentioned plate—depending on both the number of bars and the number of lasers per bar. In this case output surface of the plate shall consist of appropriate number of input plains. Output surfaces of the plate 8 are optimised so that all beams would be directed into the common output focus of the shaper 9. Such laser diode stack shaping enables efficient elimination of unfilled space between the adjacent laser diodes.

INDEX OF THE LITERATURE USED

1. W. Koechner Solid-State Laser Engineering, Springer-Verlag, $4^{th}$ ed., 1999
2. D. Shannon et al. U.S. Pat. No. 5,299,222, 1994.03.
3. E. L. Wolak, J. G. Endriz U.S. Pat. No. 6,044,096A, 2001.03.
4. W. A. Clarkson, A. B. Neilson, D. C. Hanna U.S. Pat. No. 5,825,551A, 1998.10.
5. T. Izava et al. DE19743322A1, 1998.05.
6. J. L. Nightingale et al. U.S. Pat. No. 5,798,877A, 1998.08.
7. B. Eppich, H. Weber DE19623762, 1997.12.
8. V. Lissotschenko, A. Mikhailov U.S. Pat. No. 6,421,178, 2002.07
9. J. Hentze, V. Lissotschenko, U.S. Pat. No. 5,504,302, 1996.04.
10. R. Goering, P. Schreiber, U.S. Pat. No. 6,151,168, 2000.11.
11. P. Schreiber, T. vonFreyhold, WO01/27686, 2001.04.
12. G. Piccinno, A. Agnesi, EP1059713, 2000.12.
13. R. Danielius, L. Giniūnas, LT5060, 2003.10.
14. A. Wasmeier, DE19500513 C1, 1996.07.
15. R. Goering et al., U.S. Pat. No. 6,337,873, 2002.01. (prototype).

The invention claimed is:

1. A laser beam shaper to shape asymmetrical laser light beams generated by a light source in slow and fast axis directions, the slow axis being in a plane of a p-n junction of the beams, and the fast axis being in a plane perpendicular to the plane of the p-n junction of the beams, the laser beam shaper comprising:
a first focusing element comprising an acylindrical lens located at a distance from the light source such that the beams in the direction of the fast axis are imaged directly onto an output plain of a beam shaper element;
a first multi-segment element comprising a multi-edged prism, wherein surface segments of the first multi-segment element refract the asymmetrical light beams such that the refracted beams propagate non-uniformly in the direction of the fast and slow axis without overlapping with one another; and
a second multi-segment element comprising a set of glass plates having input and output surfaces,
wherein the first and second multi-segment elements separate and redistribute the light beams, and image the light source, in the direction of the slow axis.

2. The laser beam shaper according to claim 1, wherein the acylindrical lens comprises a collimator.

3. The laser beam shaper as claimed in claim 1, wherein the second multi-segment element causes the respective propagation directions of the refracted beams to become uniform.

4. The laser beam shaper as claimed in claim 1, wherein a surface of the first multi-segment element comprise segments shaped to compensate for a distortion of the beams caused by a bending of the light source.

5. The laser beam shaper as claimed in claim 1, wherein the first multi-segment element is positioned at a first position when the light beams do not overlap with each other after passing through the first focusing element, and the first position is located nearer to the first focusing element than it is to the second multi-segment element, and
wherein the first multi-segment element is positioned at a second position when the light beams overlap with each other after passing through the first focusing element, and the second position is located further away from the first focusing element than is the first position.

6. The laser beam shaper as claimed in claim 5, wherein when the first multi-segment element is positioned at the second position, a field curvature aberration of the first focusing element is corrected by surfaces of different segments of the first multi-segment element.

7. The laser beam shaper as claimed in claim 5, wherein when the first multi-segment element is positioned at the first position, a field curvature aberration of the first focusing element is corrected by the input surfaces of the second multi-segment element.

8. The laser beam shaper as claimed in claim 1, wherein the beams propagating from the first multi-segment element comprise outer beams and inner beams, the outer beams being relatively closer to outer edges of the first multi-segment element than are the inner beams, and surfaces of the segments of the first multi-segment element direct the beams such that the outer beams propagate in the direction of the slow axis and the inner beams propagate in the direction of the fast axis.

9. The laser beam shaper as claimed in claim 1, wherein the output surfaces of the second multi-segment element are generally conical, and the beams propagating through the second multi-segment element are imaged in the direction of the slow axis to the output plane of the beam shaper element.

10. The laser beam shaper as claimed in claim 1, wherein the output surfaces of any one of the first focusing element, first multi-segment element, or second multi-segment element are shaped such that a tangent plane at any point on the outer surface of any one of the respective first focusing element, first multi-segment element, or second multi-segment element does not intersect with another point on the outer surface of the same respective element.

11. The laser beam shaper as claimed in claim 1, further comprising:
   a third multi-segment element comprising a multi-edged prism;
   a second focusing element comprising an acylindrical lens positioned between a second light source and the third multi-segment element; and
   a polarizing or dichroic mirror,
   wherein the beams generated by the two light sources after the first and third multi-segment elements are combined by the polarizing or dichroic mirror, directed through the second multi-segment element, and imaged onto the outer plain of the shaper element.

12. The laser beam shaper as claimed in claim 11, further comprising:
   third and fourth light sources to generate asymmetrical laser light beams in slow and fast directions, the third and fourth light sources each having equal wavelengths, wherein
   the beams generated by the third and fourth light sources are combined by a polarizing mirror,
   the beams generated by the first and second light sources have different wavelengths from each other and are combined by a dichroic mirror, and
   the beams combined by the polarizing and dichroic mirrors are directed through the second multi-segment element and imaged onto the outer plain of the shaper element.

13. The laser beam shaper as claimed in claim 1, wherein the first multi-segment element comprises a plurality of first multi-segment elements, each one of the multi-segment elements being configured to receive beams of light from one of a plurality of laser diodes and to direct the beams into the plate of the second multi-segment element, input surfaces of the plate unify beam propagation directions, and output surfaces of the plate focus the beams in the direction of the slow axis and direct them into common focus on the output plain of the beam shaper element.

* * * * *